United States Patent
Lin et al.

(10) Patent No.: US 9,842,771 B2
(45) Date of Patent: Dec. 12, 2017

(54) SEMICONDUCTOR DEVICE AND FABRICATION METHOD THEREOF AND SEMICONDUCTOR STRUCTURE

(71) Applicant: Siliconware Precision Industries Co., Ltd., Taichung (TW)

(72) Inventors: Chang-Fu Lin, Taichung (TW); Chin-Tsai Yao, Taichung (TW); Hung-Ming Chang, Taichung (TW); Ming-Chin Chuang, Taichung (TW); Fu-Tang Huang, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 11 days.

(21) Appl. No.: 14/272,764

(22) Filed: May 8, 2014

(65) Prior Publication Data
US 2015/0069605 A1  Mar. 12, 2015

(30) Foreign Application Priority Data
Sep. 6, 2013  (TW) .............................. 102132162 A

(51) Int. Cl.
*H01L 23/48* (2006.01)
*H01L 21/768* (2006.01)
(Continued)

(52) U.S. Cl.
CPC ........ *H01L 21/76895* (2013.01); *H01L 24/03* (2013.01); *H01L 24/05* (2013.01); *H01L 24/11* (2013.01); *H01L 24/13* (2013.01); *H01L 21/563* (2013.01); *H01L 23/3171* (2013.01); *H01L 24/16* (2013.01); *H01L 24/81* (2013.01); *H01L 2224/034* (2013.01); *H01L 2224/03912* (2013.01); *H01L 2224/0401* (2013.01); *H01L 2224/05009* (2013.01);
(Continued)

(58) Field of Classification Search
CPC ......... H01L 24/08; H01L 24/10; H01L 24/11; H01L 24/14; H01L 24/16; H01L 24/17; H01L 23/488; H01L 24/81
See application file for complete search history.

(56) References Cited

U.S. PATENT DOCUMENTS 5,251,806 A * 10/1993 Agarwala et al. ........ 228/180.22
2004/0126927 A1 * 7/2004 Lin et al. ...................... 438/107
(Continued)

*Primary Examiner* — Khiem D Nguyen
(74) *Attorney, Agent, or Firm* — Mintz Levin Cohn Ferris Glovsky and Popeo, P.C.; Peter F. Corless; Steven M. Jensen

(57) ABSTRACT

A semiconductor device is disclosed, which includes: a substrate having a plurality of connecting pads; a semiconductor component having a plurality of bonding pads formed on a surface thereof and corresponding to the connecting pads and a UBM layer formed on the bonding pads; a plurality of conductive elements each having a first conductive portion and a second conductive portion sequentially formed on the UBM layer, wherein the second conductive portion is less in width than the first conductive portion; and a plurality of solder balls formed between the second conductive portions and the connecting pads for connecting the semiconductor component and the substrate, thereby preventing solder bridging from occurring between the adjacent conductive elements and reducing stresses between the conductive elements and the UBM layer.

13 Claims, 8 Drawing Sheets

(51) Int. Cl.
*H01L 23/00* (2006.01)
*H01L 23/31* (2006.01)
*H01L 21/56* (2006.01)

(52) U.S. Cl.
CPC .............. *H01L 2224/05022* (2013.01); *H01L 2224/05558* (2013.01); *H01L 2224/05572* (2013.01); *H01L 2224/1134* (2013.01); *H01L 2224/1147* (2013.01); *H01L 2224/11462* (2013.01); *H01L 2224/11849* (2013.01); *H01L 2224/11903* (2013.01); *H01L 2224/131* (2013.01); *H01L 2224/13005* (2013.01); *H01L 2224/13017* (2013.01); *H01L 2224/13083* (2013.01); *H01L 2224/13147* (2013.01); *H01L 2224/16057* (2013.01); *H01L 2224/16058* (2013.01); *H01L 2224/16238* (2013.01); *H01L 2224/73204* (2013.01); *H01L 2224/81191* (2013.01); *H01L 2924/3841* (2013.01)

(56) References Cited

U.S. PATENT DOCUMENTS

| | | | |
|---|---|---|---|
| 2006/0051954 A1* | 3/2006 | Lin | H01L 21/4853 438/614 |
| 2007/0166993 A1* | 7/2007 | Lee | H01L 24/11 438/614 |
| 2012/0040524 A1* | 2/2012 | Kuo et al. | 438/614 |
| 2013/0127045 A1* | 5/2013 | Lin | H01L 23/293 257/737 |
| 2013/0256876 A1* | 10/2013 | Lee | H01L 24/14 257/737 |
| 2014/0264890 A1* | 9/2014 | Breuer | H01L 24/11 257/773 |

\* cited by examiner

SEMICONDUCTOR DEVICE AND FABRICATION METHOD THEREOF AND SEMICONDUCTOR STRUCTURE

CROSS-REFERENCE TO RELATED APPLICATIONS

This application claims under 35 U.S.C. §119(a) the benefit of Taiwanese Application No. 102132162, filed Sep. 6, 2013, the entire contents of which is incorporated herein by reference.

BACKGROUND OF THE INVENTION

1. Field of the Invention

The present invention relates to semiconductor devices and fabrication methods thereof and semiconductor structures, and more particularly, to a semiconductor device and a fabrication method thereof and a semiconductor structure for improving the product yield.

2. Description of Related Art

In a conventional flip-chip package, a plurality of solder bumps are formed on bonding pads of a chip for mounting the chip on a substrate. However, as I/O counts increase and the distance between the solder bumps decreases, solder bridging easily occurs between the solder bumps. To alleviate the problem, copper pillar bumps can be formed instead of the solder bumps. But as the distance between the copper pillar bumps continuously decreases, solder bridging can still occur.

FIGS. 1A and 1B are schematic cross-sectional views showing a semiconductor device and a fabrication method thereof according to the prior art.

Referring to FIG. 1A, a substrate 10 and a chip 11 are provided. The substrate 10 has at least two adjacent connecting pads 101, and the chip 11 has at least two bonding pads 111 formed on a surface 110 thereof. Further, a passivation layer 112 is formed on the surface 110 and the bonding pads 111 and a plurality of openings 113 are formed in the passivation layer 112 for exposing the bonding pads 111. A UBM (Under Bump Metallurgy) layer 114 is formed on the bonding pads 111 exposed from the openings 113 of the passivation layer 112, and an insulating layer 115 is formed on the passivation layer 112 and around peripheries of the UBM layer 114. Then, a copper pillar 12 and a solder material 13 are sequentially formed on the UBM layer 114 on each of the bonding pads 111.

Then, referring to FIG. 1B, the copper pillars 12 are bonded to the connecting pads 101 of the substrate 10 through the solder material 13 and further encapsulated by an encapsulant 14 formed between the substrate 10 and the chip 11, thus forming a semiconductor device 1.

However, referring to FIG. 1B, since the distance D between the adjacent copper pillars 12 is quite small, solder bridging 131 easily occurs to the copper pillars 12. To overcome the drawback, the width W of the copper pillars 12 can be reduced, which however reduces the contact area between the copper pillars 12 and the UBM layer 114 and consequently increases stresses therebetween. As such, cracking easily occurs between the copper pillars 12 and the UBM layer 114. Further, since the insulating layer 115 is required in the semiconductor device 1 for reducing stresses, the fabrication cost of the semiconductor device 1 is increased.

Therefore, how to overcome the above-described drawbacks has become urgent.

SUMMARY OF THE INVENTION

In view of the above-described drawbacks, the present invention provides a semiconductor device, which comprises: a substrate having a plurality of connecting pads; a semiconductor component having a plurality of bonding pads formed on a surface thereof and corresponding to the connecting pads and a UBM layer formed on the bonding pads; a plurality of conductive elements each having a first conductive portion and a second conductive portion sequentially formed on the UBM layer, wherein the second conductive portion is less in width than the first conductive portion; and a plurality of solder balls formed between the second conductive portions and the connecting pads for connecting the semiconductor component and the substrate.

The semiconductor device can further comprise an encapsulant formed between the substrate and the semiconductor component for encapsulating the conductive elements and the solder balls.

The present invention further provides a semiconductor structure, which comprises: a semiconductor component having a plurality of bonding pads formed on a surface thereof and a UBM layer formed on the bonding pads; and a plurality of conductive elements each having a first conductive portion and a second conductive portion sequentially formed on the UBM layer, wherein the second conductive portion is less in width than the first conductive portion.

The semiconductor structure can further comprise a solder material formed on the second conductive portion.

The above-described semiconductor device and semiconductor structure can further comprise a passivation layer formed on the surface of the semiconductor component and the bonding pads and having a plurality of first openings exposing the bonding pads such that the UBM layer is formed on the bonding pads exposed from the first openings and portions of the passivation layer.

In the above-described semiconductor device and semiconductor structure, the UBM layer can have a plurality of second openings formed on a surface thereof and the first conductive portions can be formed on the surface of the UBM layer and in the second openings.

The present invention further provides a fabrication method of a semiconductor device, which comprises the steps of: providing a substrate having a plurality of connecting pads and providing a semiconductor component having a plurality of bonding pads formed on a surface thereof and corresponding to the connecting pads; forming a metal layer on the bonding pads of the semiconductor component; forming a plurality of first conductive portions on the metal layer corresponding in position to the bonding pads; forming a second conductive portion on each of the first conductive portions, wherein the second conductive portion is less in width than the first conductive portion; and forming a plurality of solder balls between the second conductive portions and the connecting pads for connecting the semiconductor component and the substrate.

The above-described method can further comprise forming a passivation layer on the surface of the semiconductor component and the bonding pads, wherein the passivation layer has a plurality of first openings for exposing the bonding pads, and the metal layer is formed on the passivation layer and the bonding pads exposed from the first openings.

In the above-described method, the metal layer can have a plurality of second openings formed on a surface thereof and the first conductive portions can be formed on the surface of the metal layer and in the second openings.

In the above-described method, forming the first conductive portions on the metal layer can comprise the steps of: forming a first photo resist layer on the metal layer, wherein the first photo resist layer has a plurality of openings corresponding in position to the bonding pads for exposing portions of the metal layer; forming the first conductive portions on the portions of the metal layer exposed from the openings of the first photo resist layer; and removing the first photo resist layer.

In the above-described method, forming the second conductive portions on the first conductive portions can comprise the steps of: forming a second photo resist layer on the metal layer and the first conductive portions, wherein the second photo resist layer has a plurality of openings for exposing the first conductive portions and the openings of the second photo resist layer are less in width than the openings of the first photo resist layer; and forming the second conductive portions on the first conductive portions in the openings of the second photo resist layer.

In the above-described method, forming the solder balls can comprise the steps of: forming a solder material on the second conductive portions in the openings of the second photo resist layer; heating the solder material to form the solder balls; and removing the second photo resist layer.

The above-described method can further comprise removing the metal layer outside peripheries of the first conductive portions so as to form a UBM layer.

The above-described method can further comprise forming an encapsulant between the substrate and the semiconductor component for encapsulating the first and second conductive portions and the solder balls.

In the above-described semiconductor device and the fabrication method thereof and the semiconductor structure, the width of the second conductive portion can be 30 to 70 percent of the width of the first conductive portion. The second conductive portion can be less in height than the first conductive portion. The height of the second conductive portion can be 25 to 50 percent of the height of the first conductive portion.

In the above-described semiconductor device and the fabrication method thereof and the semiconductor structure, the first conductive portion and the second conductive portion can be integrally or separately formed. The first conductive portion and the second conductive portion can be made of same or different materials. The first conductive portion and the second conductive portion of each of the conductive elements can be made of copper and the conductive element can be a copper pillar.

Therefore, the present invention mainly involves sequentially forming a first conductive portion and a second conductive portion of a conductive element on a UBM layer of a semiconductor component and the second conductive portion is less in width and height that the first conductive portion.

By dispensing with the insulating layer as required in the prior art, the present invention reduces the fabrication cost of the semiconductor device and the semiconductor structure. Further, the first conductive portions can be greater in width than conventional copper pillars so as to increase the contact area between the first conductive portions and the UBM layer, thereby reducing stresses therebetween. Furthermore, the second conductive portions can be less in width than the conventional copper pillars so as to increase the distance between adjacent second conductive portions, thus preventing solder bridging from occurring therebetween and increasing the produce yield.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "first", "second", "on", "a" etc. are merely for illustrative purposes and should not be construed to limit the scope of the present invention.

Figure 2A:
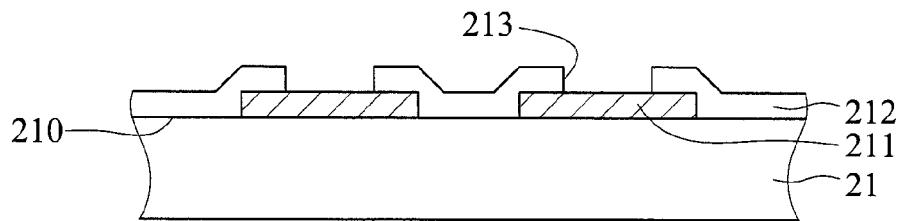
FIGS. 2A to 2N are schematic cross-sectional views showing a semiconductor device and a fabrication method thereof according to a first embodiment of the present invention.
Figure 2B:
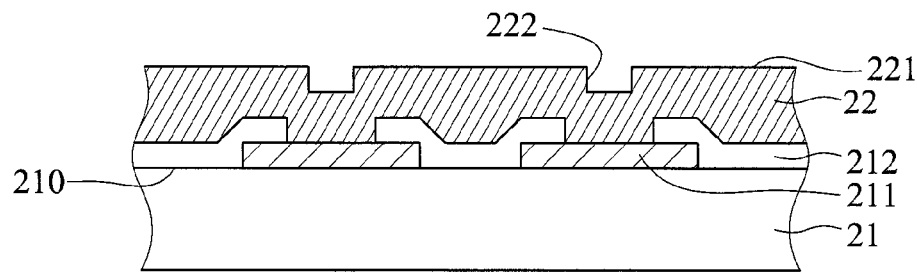
Figure 2C:
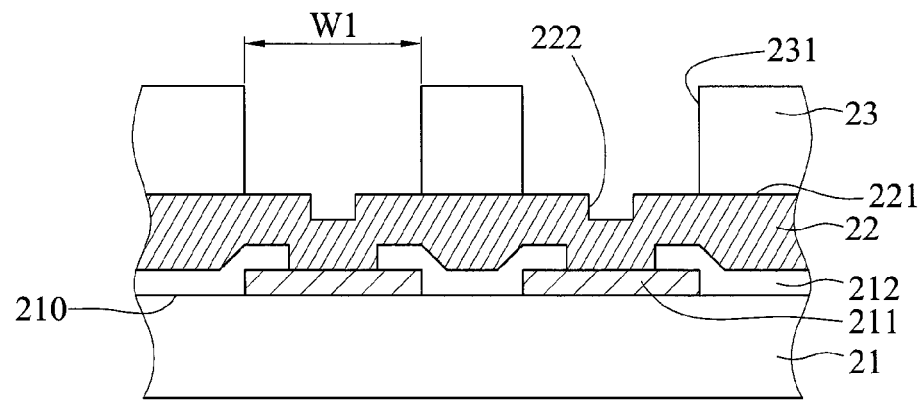
Figure 2D:
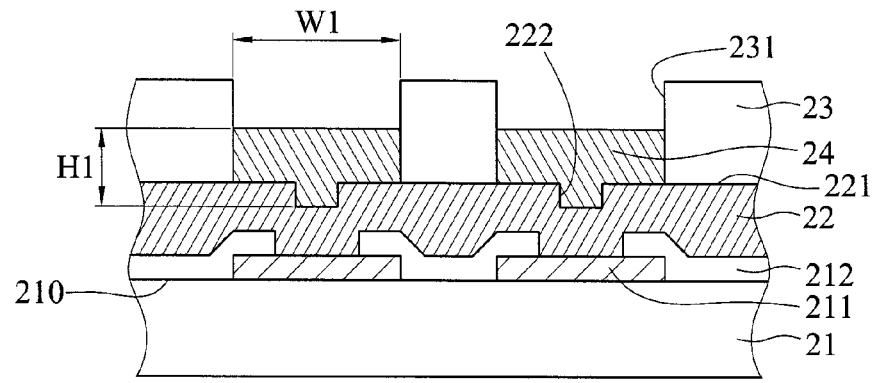
Figure 2E:
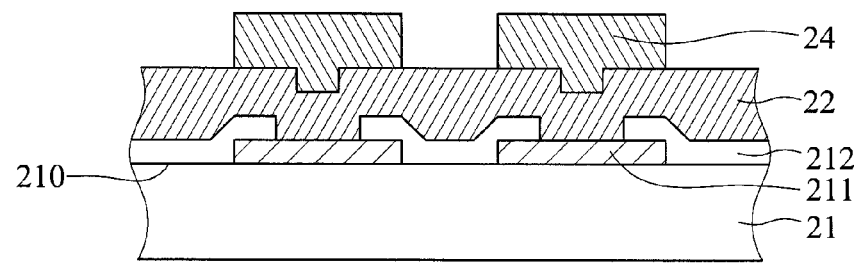
Figure 2F:
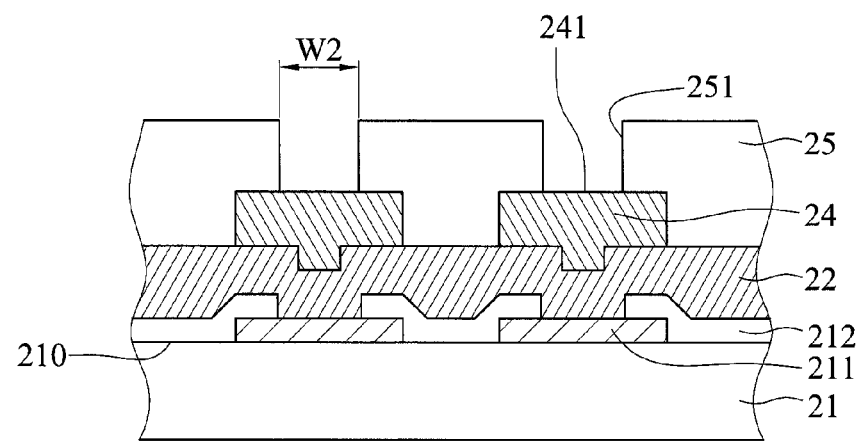
Figure 2G:
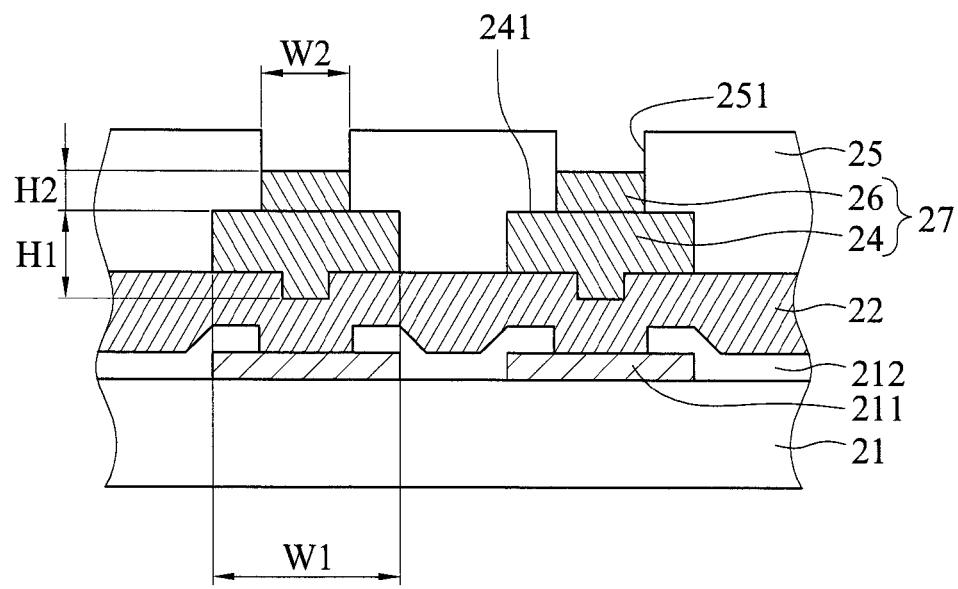
Figure 2H:
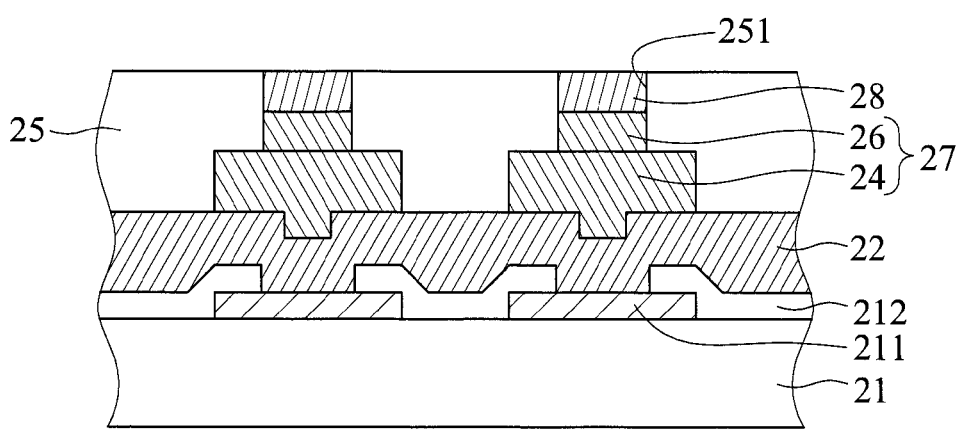
Figure 2I:
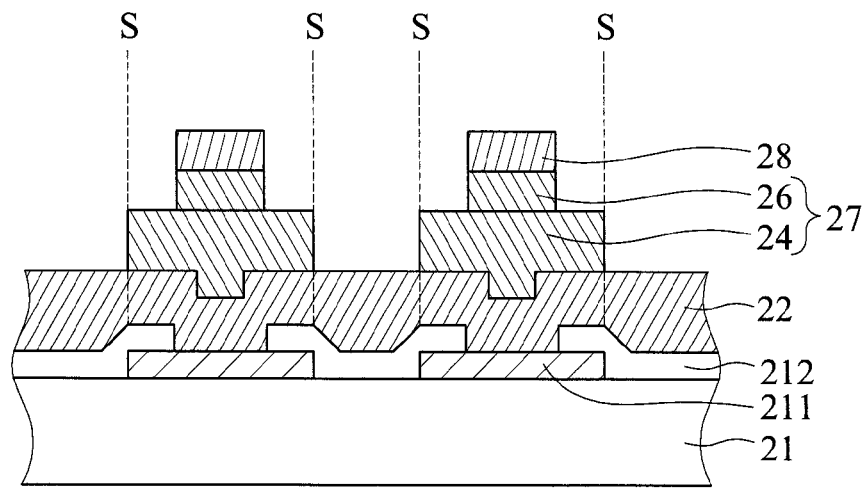
Figure 2J:
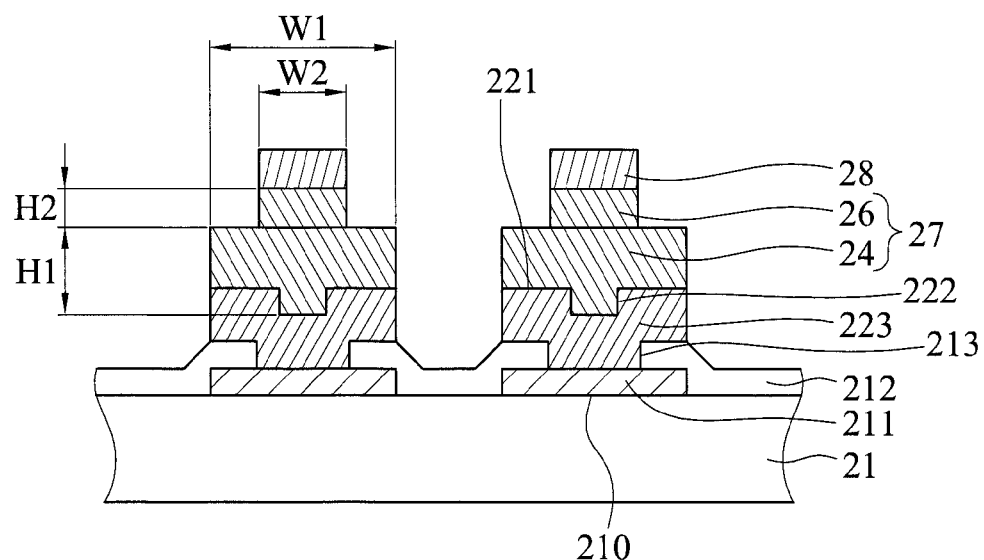
Figure 2K:
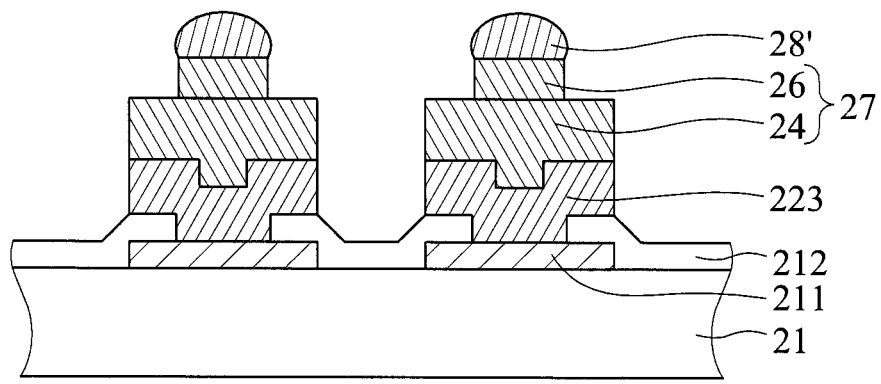
Figure 2L:
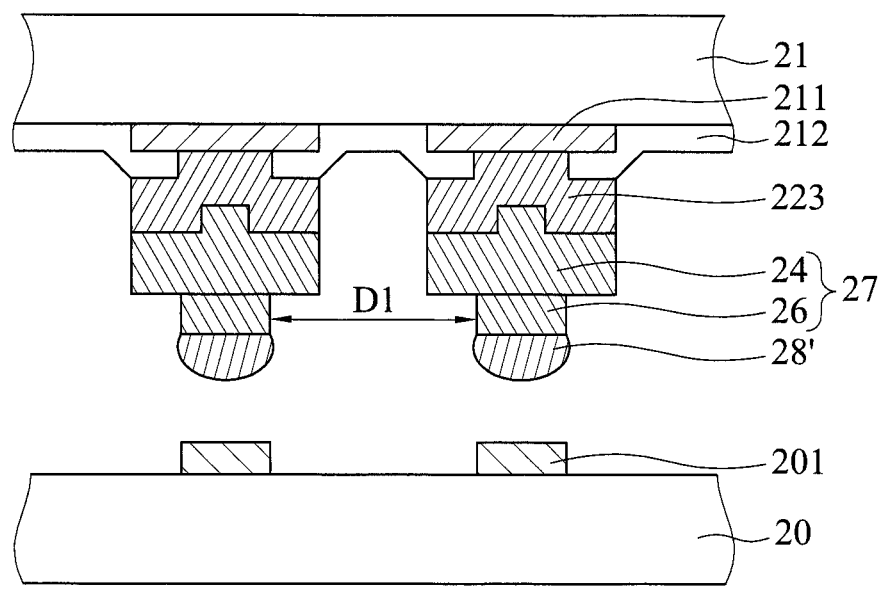
Figure 2M:
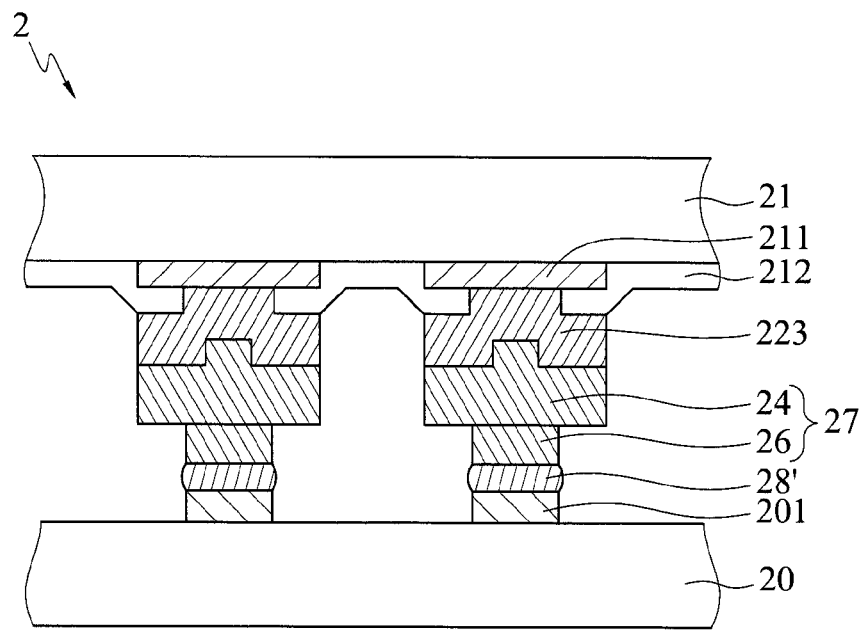
Figure 2N:
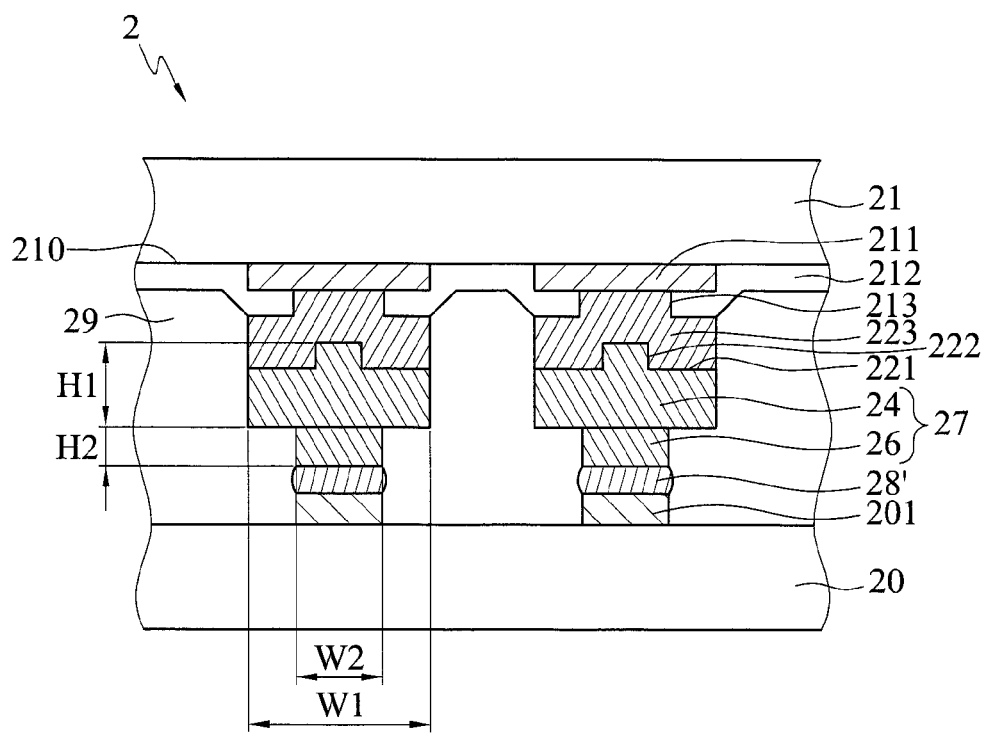

FIGS. 2A to 2N are schematic cross-sectional views showing a semiconductor device and a fabrication method thereof according to a first embodiment of the present invention.

Referring to FIG. 2A, a semiconductor component 21 such as a semiconductor chip is provided. The semiconductor component 21 has at least two adjacent bonding pads 211 formed on a surface 210 thereof. Further, a passivation layer 212 is formed on the surface 210 and the bonding pads 211 and has a plurality of first openings 213 for exposing the bonding pads 211.

Referring to FIG. 2B, a metal layer 22 is formed on the passivation layer 212 and the exposed bonding pads 211. The metal layer 22 has a plurality of second openings 222 formed on a surface 221 thereof.

In other embodiments, the metal layer 22 can be directly formed on the surface 210 of the semiconductor component 21 and the bonding pads 211. Further, the second openings 222 can be omitted in other embodiments.

Referring to FIG. 2C, a first photo resist layer 23 is formed on the surface 221 of the metal layer 22. The first photo resist layer 23 has a plurality of openings 231 corresponding in position to the bonding pads 211 for exposing portions of the surface 221 and the second openings 222 of the metal layer 22. The openings 231 of the first photo resist layer 23 have a width of W1.

Referring to FIG. 2D, by performing such as an electroplating process, a plurality of first conductive portions 24 are formed on the exposed portions of the surface 221 and in the second openings 222 of the metal layer 22. The first conductive portions 24 have a width of W1 and a height of H1.

Referring to FIG. 2E, the first photo resist layer 23 is removed.

Referring to FIG. 2F, a second photo resist layer 25 is formed on the metal layer 22 and the first conductive portions 24, and has a plurality of openings 251 for exposing surfaces 241 of the first conductive portions 24. The openings 251 of the second photo resist layer 25 have a width W2 less than the width W1 of the openings 231 of the first photo resist layer 23.

Referring to FIG. 2G, by performing such as an electroplating process, a plurality of second conductive portions 26 are formed on the first conductive portions 24 in the openings 251 of the second photo resist layer 25 so as to form a plurality of conductive elements 27 each having a first conductive portion 24 and a second conductive portion 26.

The second conductive portion 26 has a width W2 less than the width W1 of the first conductive portion 24. Further, the second conductive portion 26 has a height H2 less than the height H1 of the first conductive portion 24. The first conductive portion 24 can have a T-shape, the second conductive portion 26 can have a straight line shape, and the conductive element 27 can have a cross shape.

Referring to FIG. 2H, a solder material 28 is formed on the second conductive portions 26 in the openings 251 of the second photo resist layer 25.

Referring to FIG. 2I, the second photo resist layer 25 is removed.

Referring to FIG. 2J, an etching process is performed along lines S of FIG. 2I so as to remove the metal layer 22 outside peripheries of the first conductive portions 24, thereby forming a substantially U-shaped or V-shaped UBM layer 223.

Referring to FIG. 2K, the solder material 28 is heated to form a plurality of solder balls 28'.

Referring to FIG. 2L, the overall structure of FIG. 2K is turned upside down to cause the solder balls 28' to correspond in position to connecting pads 201 of a substrate 20.

The adjacent second conductive portions 26 of the present invention have a distance D1 that is greater than the distance D between the conventional adjacent copper pillars 12, thereby preventing solder bridging from occurring between the adjacent second conductive portions 26.

Referring to FIG. 2M, the second conductive portions 26 are bonded to the connecting pads 201 through the solder balls 28' to thereby electrically connect the semiconductor component 21 and the substrate 20.

Referring to FIG. 2N, an encapsulant 29 is formed between the substrate 20 and the passivation layer 212 of the semiconductor component 21 for encapsulating the substrate 20, the connecting pads 201, the passivation layer 212, the UBM layer 223, the conductive elements 27 and the solder balls 28'.

The present invention further provides a semiconductor structure having a semiconductor component 21 and a plurality of conductive elements 27.

The semiconductor component 21 has at least two adjacent bonding pads 211 formed on a surface 210 thereof and a UBM layer 223 formed on the bonding pads 211. Each of the conductive elements 27 has a first conductive portion 24 and a second conductive portion 26 sequentially formed on the UBM layer 223. Therein, the width W2 of the second conductive portion 26 is less than the width W1 of the first conductive portion 24, and the height H2 of the second conductive portion 26 is less than the height H1 of the first conductive portion 24.

The semiconductor structure can further have a solder material 28 formed on the second conductive portions 26.

In the present embodiment, the width W2 of the second conductive portions 26 can be 30 to 70 percent of the width W1 of the first conductive portions 24. The height H2 of the second conductive portions 26 can be 25 to 50 percent of the height H1 of the first conductive portions 24. The first conductive portions 24 and the second conductive portions 26 can be integrally or separately formed and made of same or different materials. The first conductive portions 24 and the second conductive portions 26 can be made of copper or other conductive materials, and the conductive elements 27 can be such as copper pillars.

The semiconductor component 21 can further have a passivation layer 212 formed on the surface 210 and the bonding pads 211. The passivation layer 212 has a plurality of first openings 213 exposing the bonding pads 211 such that the UBM layer 223 is formed on the bonding pads 211 exposed from the first openings 213 and portions of the passivation layer 212.

The UBM layer 223 can have a plurality of second openings 222 formed on a surface 221 thereof and the first conductive portions 24 can be formed on the surface 221 of the UBM layer 223 and in the second openings 222.

Referring to FIG. 2N, the present invention further provides a semiconductor device 2 having a substrate 20, a semiconductor component 21, a plurality of conductive elements 27 and a plurality of solder balls 28'.

The substrate 20 has at least two adjacent connecting pads 201. The semiconductor component 21 has a plurality of bonding pads 211 formed on a surface 210 thereof and corresponding to the connecting pads 201 and a UBM layer 223 formed on the bonding pads 211.

Each of the conductive elements 27 has a first conductive portion 24 and a second conductive portion 26 sequentially formed on the UBM layer 223, and the width W2 of the second conductive portion 26 is less than the width W1 of the first conductive portion 24. The solder balls 28' are formed between the second conductive portions 26 and the connecting pads 201.

In the present embodiment, the width W2 of the second conductive portions 26 can be 30 to 70 percent of the width W1 of the first conductive portions 24. The height H2 of the second conductive portions 26 can be 25 to 50 percent of the height H1 of the first conductive portions 24. The first conductive portions 24 and the second conductive portions 26 can be integrally or separately formed and made of same or different materials. The first conductive portions 24 and the second conductive portions 26 can be made of copper or other conductive materials, and the conductive elements 27 can be such as copper pillars.

The semiconductor component 21 can further have a passivation layer 212 formed on the surface 210 and the bonding pads 211. The passivation layer 212 has a plurality of first openings 213 exposing the bonding pads 211 such that the UBM layer 223 is formed on the bonding pads 211 exposed from the first openings 213 and portions of the passivation layer 212.

The UBM layer 223 can have a plurality of second openings 222 formed on a surface 221 thereof and the first conductive portions 24 can be formed on the surface 221 of the UBM layer 223 and in the second openings 222.

The semiconductor device 2 can further have an encapsulant 29 formed between the substrate 20 and the passivation layer 212 of the semiconductor component 21 for encapsulating the substrate 20, the connecting pads 201, the passivation layer 212, the UBM layer 223, the conductive elements 27 and the solder balls 28'.

Figure 3:
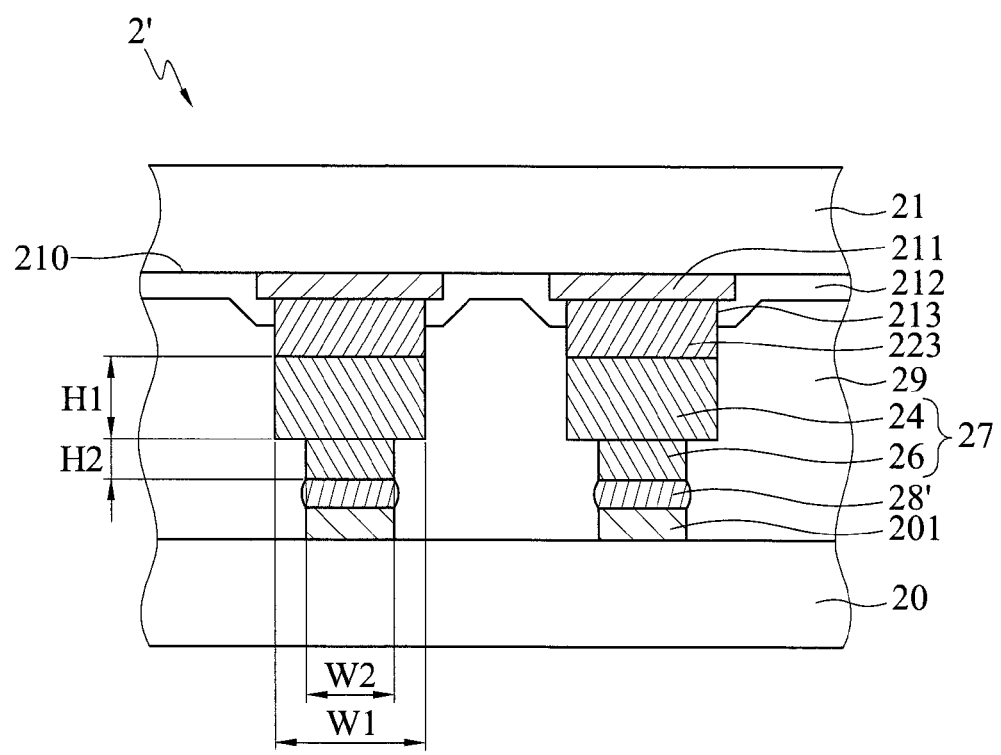
FIG. 3 is a schematic cross-sectional view showing a semiconductor device according to a second embodiment of the present invention.

FIG. 3 is a schematic cross-sectional view of a semiconductor device 2' according to a second embodiment of the present invention. Different from the first embodiment, the second openings 222 of FIG. 2N are omitted in the present embodiment and each of the UBM layer 223, the first conductive portions 24 and the second conductive portions 26 has a straight line shape and each of the conductive elements 27 has a T-shape.

Therefore, the present invention mainly involves sequentially forming a first conductive portion and a second conductive portion of a conductive element on a UBM layer of a semiconductor component and the second conductive portion is less in width and height that the first conductive portion.

Figure 1A:
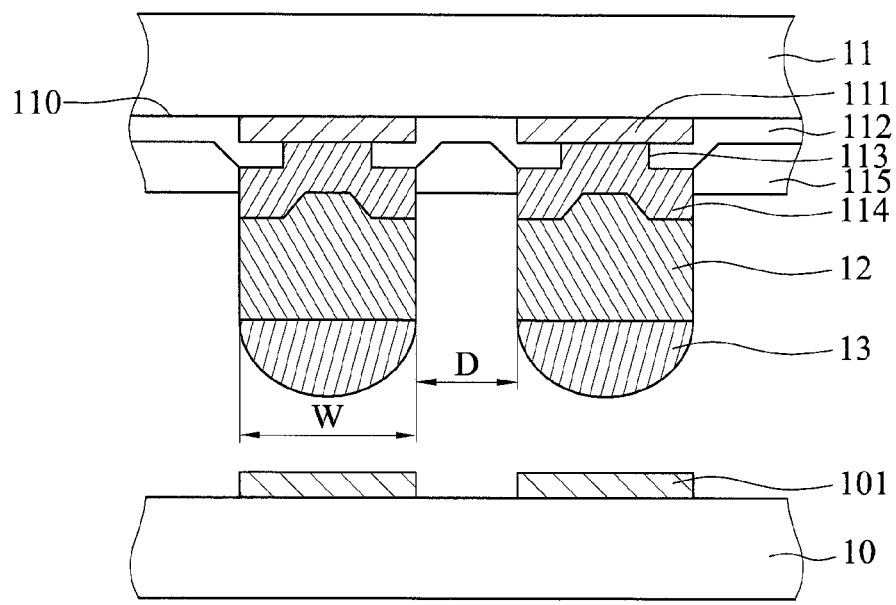
FIGS. 1A and 1B are schematic cross-sectional views showing a semiconductor device and a fabrication method thereof according to the prior art.
Figure 1B:
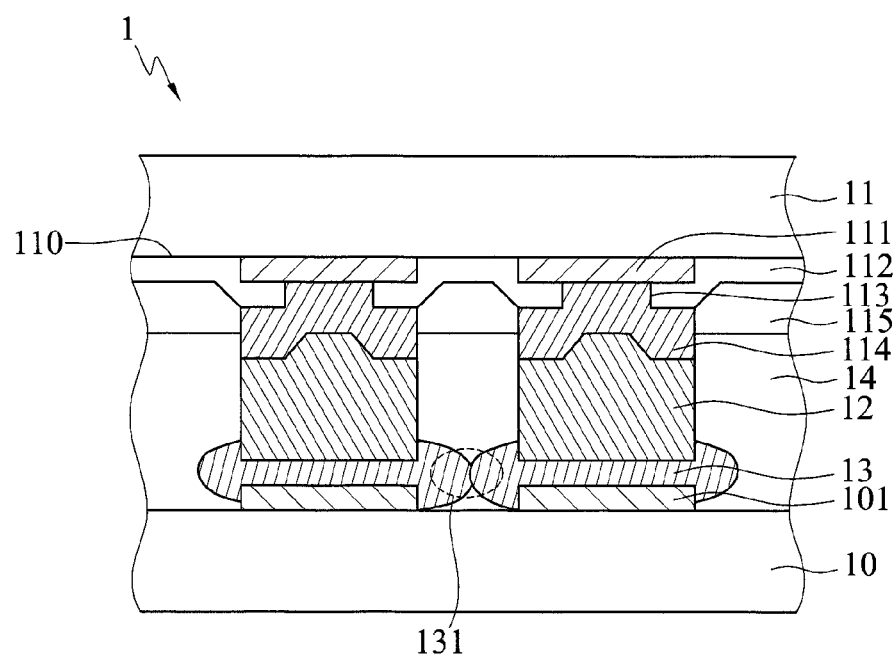

By dispensing with the insulating layer (shown in FIGS. 1A and 1B) as required in the prior art, the present invention reduces the fabrication cost of the semiconductor device and the semiconductor structure. Further, the width of the first conductive portions (for example, 50 um) can be greater than the width of the conventional copper pillars (for example, 40 um) so as to increase the contact area between the first conductive portions and the UBM layer, thereby reducing stresses therebetween. Furthermore, the width of the second conductive portions (for example, 30 um) can be less than the width of the conventional copper pillars (for example, 40 um) so as to increase the distance between adjacent second conductive portions, thus preventing solder bridging from occurring therebetween and increasing the produce yield.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A semiconductor device, comprising:
    a substrate having a plurality of connecting pads;
    a semiconductor component having a plurality of bonding pads formed on a surface thereof and corresponding in position to the connecting pads and a UBM layer formed on the bonding pads;
    a plurality of conductive elements each having a first conductive portion and a second conductive portion sequentially formed on the UBM layer, wherein a portion of a top surface of the first conductive portion is exposed from the second conductive portion; and
    a plurality of solder balls formed between the second conductive portions and the connecting pads for connecting the semiconductor component and the substrate,
    wherein the solder balls directly contact the second conductive portions and the connecting pads, and
    the second conductive portion, each of the solder balls, and each of the connecting pads are less in width than the first conductive portion.

2. The semiconductor device of claim 1, further comprising an encapsulant formed between the substrate and the semiconductor component for encapsulating the conductive elements and the solder balls.

3. A fabrication method of a semiconductor device, comprising the steps of:
    providing a substrate having a plurality of connecting pads and providing a semiconductor component having a plurality of bonding pads formed on a surface thereof and corresponding to the connecting pads;
    forming a metal layer on the bonding pads of the semiconductor component;
    forming a plurality of first conductive portions on the metal layer corresponding in position to the bonding pads;
    forming a second conductive portion on each of the first conductive portions, wherein a portion of a top surface of the first conductive portion is exposed from the second conductive portion; and
    forming a plurality of solder balls between the second conductive portions and the connecting pads for connecting the semiconductor component and the substrate,
    wherein the solder balls directly contact the second conductive portions and the connecting pads, and
    each of the solder balls, each of the connecting pads, and the second conductive portion are less in width than the first conductive portion.

4. The fabrication method of claim 3, further comprising forming a passivation layer on the surface of the semiconductor component and the bonding pads, wherein the passivation layer has a plurality of first openings for exposing the bonding pads, and the metal layer is formed on the passivation layer and the bonding pads exposed from the first openings.

5. The fabrication method of claim 3, wherein the metal layer has a plurality of second openings formed on a surface thereof and the first conductive portions are formed on the surface of the metal layer and in the second openings.

6. The fabrication method of claim 3, wherein the width of the second conductive portion is 30 to 70 percent of the width of the first conductive portion.

7. The fabrication method of claim 3, wherein the second conductive portion is less in height than the first conductive portion.

8. The fabrication method of claim 7, wherein the height of the second conductive portion is 25 to 50 percent of the height of the first conductive portion.

9. The fabrication method of claim 3, wherein forming the first conductive portions on the metal layer comprises the steps of:
    forming a first photo resist layer on the metal layer, wherein the first photo resist layer has a plurality of openings corresponding in position to the bonding pads for exposing portions of the metal layer;
    forming the first conductive portions on the portions of the metal layer exposed from the openings of the first photo resist layer; and
    removing the first photo resist layer.

10. The fabrication method of claim 9, wherein forming the second conductive portions on the first conductive portions comprises the steps of:
    forming a second photo resist layer on the metal layer and the first conductive portions, wherein the second photo resist layer has a plurality of openings for exposing the first conductive portions and the openings of the second photo resist layer are less in width than the openings of the first photo resist layer; and
    forming the second conductive portions on the first conductive portions in the openings of the second photo resist layer.

11. The fabrication method of claim 10, wherein forming the solder balls comprises the steps of:
    forming a solder material on the second conductive portions in the openings of the second photo resist layer;
    heating the solder material to form the solder balls; and
    removing the second photo resist layer.

12. The fabrication method of claim 3, further comprising removing the metal layer outside peripheries of the first conductive portions so as to form a UBM layer.

13. The fabrication method of claim 3, further comprising forming an encapsulant between the substrate and the semiconductor component for encapsulating the first and second conductive portions and the solder balls.

\* \* \* \* \*